United States Patent [19]

Fukui

[11] Patent Number: 5,270,492

[45] Date of Patent: Dec. 14, 1993

[54] STRUCTURE OF LEAD TERMINAL OF ELECTRONIC DEVICE

[75] Inventor: Masaro Fukui, Kyoto, Japan

[73] Assignee: Rohm Co., LTD., Kyoto, Japan

[21] Appl. No.: 919,892

[22] Filed: Jul. 27, 1992

[30] Foreign Application Priority Data

Aug. 26, 1991 [JP] Japan ............................ 3-240407

[51] Int. Cl.⁵ .................. H01L 23/02; H01R 9/00
[52] U.S. Cl. .................... 174/52.4; 174/52.2;
361/772; 361/773; 361/774
[58] Field of Search ............ 361/404, 405, 406, 407,
361/408, 409, 421; 174/50.52, 50.53, 50.55,
50.56, 50.59, 50.6, 52.2, 52.4, ; 257/666, 674

[56] References Cited

U.S. PATENT DOCUMENTS 4,991,059  2/1991  Kiyose ...................... 361/405

Primary Examiner—Leo P. Picard
Assistant Examiner—Bot Ledynh
Attorney, Agent, or Firm—Brumbaugh, Graves, Donohue & Raymond

[57] ABSTRACT

A small bore or a cut portion is formed in a leading end portion of a lead terminal extended from a package main body. A gas produced when the leading end portion is contacted with and soldered to a land provided on a printed wiring board is allowed to escape through the small bore or the cut portion and, therefore, solder is easy to enter between the lead terminal and the land, which improves the soldering performance of the lead terminal. Also, the provision of the small bore or cut portion increases the area of a peripheral portion of the lead terminal to be in contact with the solder to thereby increasing the strength of the soldering.

4 Claims, 2 Drawing Sheets

STRUCTURE OF LEAD TERMINAL OF ELECTRONIC DEVICE

BACKGROUND OF THE INVENTION

The present invention relates to a structure of the lead terminal of an electronic device such as a semiconductor device or the like, and in particular, to a structure of the lead terminal of an electronic device of a surface mounting type.

Conventionally, most of electronic devices have been connected to a printed wiring board by inserting the lead terminal thereof into a through hole formed in the printed wiring board and soldering it. However, in recent years, as electric machines and apparatuses have been made compact in size and thin in thickness, a so-called surface mounted type of electronic device has been widely employed, which can be connected to the printed wiring board by bringing the lead terminal thereof into contact with a land provided on the printed wiring board and soldering it.

FIG. 5 shows an external appearance of a typical electronic device of a surface mounting type. In FIG. 5, reference numeral 1 designates a package main body in which a semiconductor element or the like is hermetically sealed. The package main body can be produced, for example, by molding an epoxy resin. A lead terminal 2 is extended from the package main body 1 and the lead terminal has a surface which is plated by soldering or by similar methods. Each of the lead terminals 2 is formed in such a manner that it is bent in a substantially L-shaped configuration, the leading end portion 2a thereof can be brought into contact with a land provided on a printed wiring board and then can be connected by soldering onto the land.

FIG. 6 is a sectional view to show a state in which the above-mentioned electronic device is soldered to a printed wiring board. In this figure, reference numeral 3 designates a printed wiring board, 4 designates a land provided on the printed wiring board 3, and 5 designates a solder which is used to connect the leading end portion 2a of the lead terminal 2 with the land 4. A method of soldering the electronic device of a surface mounting type includes a so-called re-flow method in which the lead terminal 2 and the land 4 are previously coated with a solder film by solder plating or the like and then the printed wiring board 3 with the electronic device mounted thereon is put into a high temperature atmosphere or a laser beam is applied to the soldered portion to thereby solder the lead terminal 2 to the land 4, a method which uses a solder paste to connect the lead terminal 2 and the land 4 with each other, a method in which, with the electronic device being mounted on and fixed to the printed wiring board 3 with an adhesive, the printed wiring board 3 is immersed into a solder tank to thereby achieve such soldering connection, and other similar methods.

However, the above-described conventional electronic device to be soldered by the above-mentioned methods has some problems to be solved as follows:

That is, since the leading end portion 2a of the lead terminal 2 of the conventional electronic device is formed in a flat-plate shape, a gas from flux or the like produced when the printed wiring board 3 and the land 4 are soldered together, is easy to enter between the leading end portion 2a of the lead terminal 2 and the land 4, which makes it difficult for the solder to enter into the gas existing portion to thereby generate poor soldering.

Also, since the area of the leading portion 2a of the lead terminal 2 of the electronic device of this type is too small to have an adequate contact area with the solder, the soldered portion may be peeled off by a stress generated when the printed wiring board 3 is warped.

SUMMARY OF THE INVENTION

The present invention was made to eliminate the drawbacks found in the above-mentioned conventional electronic device of a surface mounting type. Accordingly, it is an object of the invention to improve a soldering reliability of an electronic device of a surface mounting type.

In order to achieve the above object, according to the present invention, there is provided an improved structure of the lead terminal of a surface mounting type of electronic device which is constructed in such a manner that the leading portion of the lead terminal of the electronic device is brought into contact with a land provided on a printed wiring board before they are soldered together, characterized in that at least the leading end portion of the lead terminal to be brought into contact with the land is formed with a bore or a cut portion.

According to the present invention, since the leading portion of the lead terminal to be brought into contact with the land of the printed wiring board is formed with a bore or a cut portion, a gas produced in the soldering is allowed to escape through the bore or the cut portion, which makes it easy for the solder to enter between the lead terminal and the land. Further, the area of a peripheral portion of the lead terminal to be in contact with the solder is increased by an amount corresponding to the bore or the cut portion formed in the lead terminal so that the strength of the soldering can be improved accordingly.

DETAILED DESCRIPTION OF THE INVENTION

Figure 1:
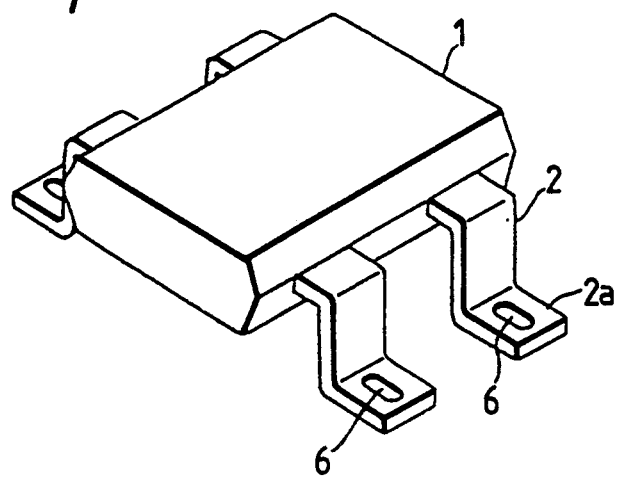
FIG. 1 is a perspective view of a structure of the lead terminal of an electronic device according to a first embodiment of the present invention.

Preferred embodiments of the present invention will be described with reference to FIGS. 1 to 4. In these figures, parts designated by the same reference characters as in FIG. 5 are similar in structure to those employed in the conventional electronic device and thus the description thereof is omitted here.

First Embodiment

FIG. 1 shows a first embodiment in which the leading end portions 2a of the respective lead terminals 2 are respectively formed with a small bore 6.

Second Embodiment

Figure 2:
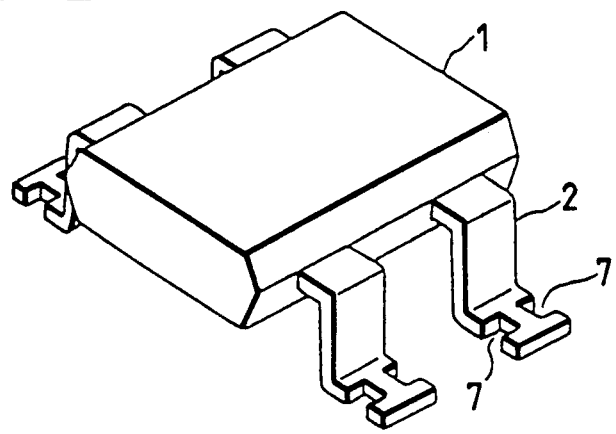
FIG. 2 is a perspective view of a structure of the lead terminal of an electronic device according to a second embodiment of the present invention.

FIG. 2 shows a second embodiment in which each of the leading end portions 2a of the lead terminals 2 is formed on both side surface portions thereof with a cut portion 7 which is formed substantially in a U shape.

Third Embodiment

Figure 3:
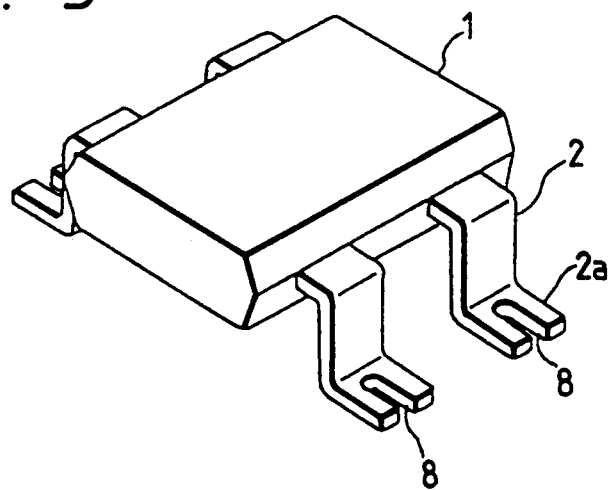
FIG. 3 is a perspective view of a structure of the lead terminal of an electronic device according to a third embodiment of the present invention.

FIG. 3 shows a third embodiment in which each of the leading end portions 2a of the lead terminals 2 is formed on its end edge portion with a cut portion 7 which is formed substantially in a U shape.

Fourth Embodiment

Figure 4:
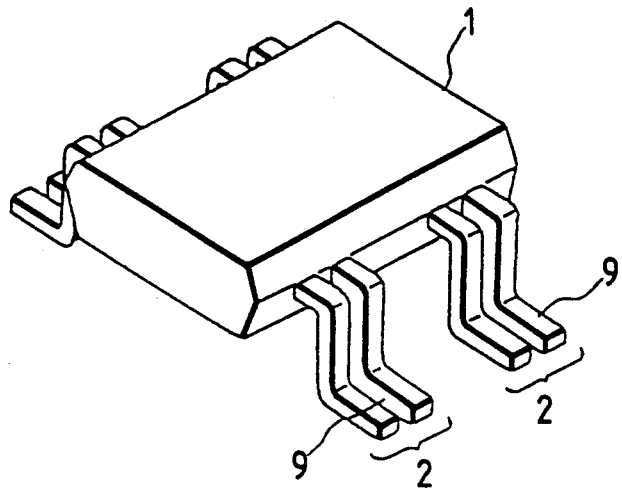
FIG. 4 is a perspective view of a structure of the lead terminal of an electronic device according to a fourth embodiment of the present invention.
Figure 5:
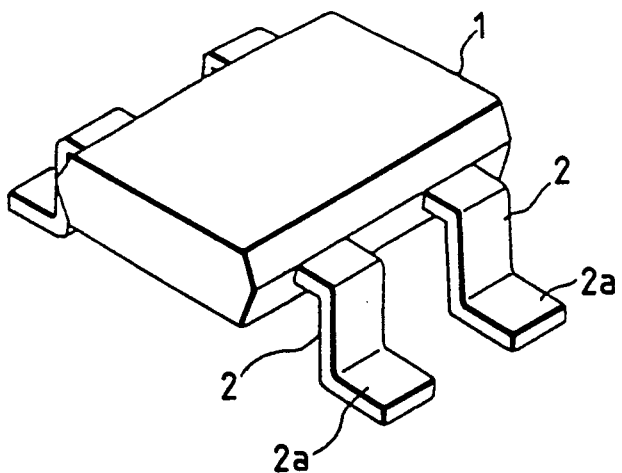
FIG. 5 is a perspective view of a structure of the lead terminal of an electronic device according to the prior art.
Figure 6:
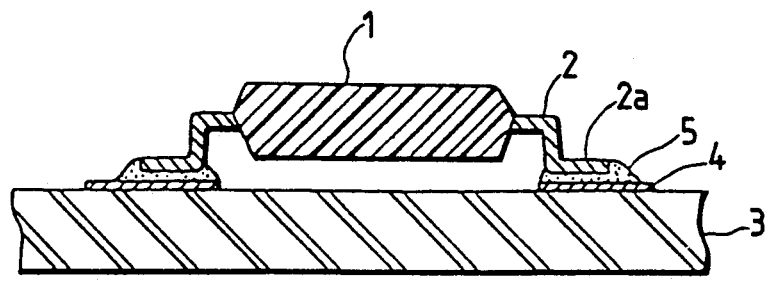
FIG. 6 is a sectional view of a soldered electronic device according to the prior art.

FIG. 4 shows a fourth embodiment in which each of the lead terminals 2 is formed with an elongated cut portion 9 cut the lead terminal 2 in two in the longitudinal direction thereof.

<Comparison and Evaluation of Soldering Performance>

The electronic device according to the third embodiment shown in FIG. 3 was compared on the soldering performance with the electronic device according to the prior art shown in FIG. 5. The soldering test was conducted under the conditions that the respective electronic devices were provisionally secured to the printed wiring board 3 with an adhesive and were then immersed in a static solder tank. The solder used was an eutectic solder and the temperature of the eutectic solder was set at 235° C. When the electronic devices were immersed in the solder tank for a time of 2 seconds or more, neither of them produced poor soldering. However, for immersion of the devices in the solder for a time of 1 second, the electronic device according to the present embodiment showed a percentage of 0% on poor soldering, while the electronic device according to the prior art showed a percentage of 10% on poor soldering in the lead terminal unit. This shows that the electronic device according to the present embodiment is much better in the soldering performance than the conventional electronic device.

As has been described before, in the illustrated embodiments of the invention, a bore or a cut portion is formed in the leading end portion of the lead terminal. However, the invention is not limited to the above-mentioned embodiments, but other various kinds of embodiments can be enforced. For example, the bore may be formed in a true circle not in an elongated bore, and the cut portion may also be formed in a curved shape.

Also, the operation of forming the bore or cut portion in the lead terminal 2 in the respective embodiments mentioned before can be conducted in any of the stages of producing the electronic device. In order to reduce the burden of the steps of assembling the electronic device, the bore or cut portion may be preferably formed in the step of producing a lead frame.

Further, in the illustrated embodiments, the electronic device shown herein includes four lead terminals. However, the number of the lead terminals is not limited to four. Also, the present invention can also be applied to an electronic device of a type that the lead terminals thereof are guided from four directions of the package main body.

In addition, the electronic device of the present invention is not limited to the semiconductor device, but the present invention can also be applied to a device packaging a chip resistor, a chip condenser or the like.

As can be clearly understood from the foregoing description, according to the present invention, since each of the lead terminals is formed at its leading end portion with a bore or a cut portion to thereby allow the gas produced in the soldering operation to escape through the bore or cut portion, it is easier for the solder to enter between the lead terminal and a land provided on a printed wiring board, which improves the soldering performance of an electronic device of a surface mounting type of this kind. Further, since the area of a peripheral portion of the lead terminal to be in contact with the solder is increased by an amount corresponding to the bore or cut portion formed in the lead terminal, the strength of the soldering of the electronic device can be increased.

What is claimed is:

1. A lead terminal of an electronic device of a surface mounting type which can be soldered to a printed wiring board after bringing a leading end portion of said lead terminal into contact with a land provided on a surface of said printed wiring board comprising a metal lead strip having a main body and a leading end portion bent at an angle to the main body at a bent region of the strip to provide substantially planar engagement with a land on a printed wiring board, the main body and the bent region of the lead terminal being imperforate and the leading end portion being formed with at least one gas-releasing passage within the periphery of the leading end portion for releasing a gas produced in soldering.

2. A lead terminal of an electronic device as claimed in claim 1, wherein said gas-releasing passage is a bore formed in said leading end portion.

3. A lead terminal of an electronic device as claimed in claim 1, wherein said gas-releasing passage is a cut portion formed substantially in a U-shape at opposite side surface portions of said leading end portion.

4. A lead terminal of an electronic device as claimed in claim 1, wherein said gas-releasing passage is a cut portion formed substantially in a U-shape at an end edge portion of said leading end portion.

* * * * *